United States Patent [19]

Hütter et al.

[11] Patent Number: 4,558,379

[45] Date of Patent: Dec. 10, 1985

[54] DISTURBANCE DETECTION AND RECORDING SYSTEM

[75] Inventors: Helmut Hütter, Stuttgart; Heinz Maier, Ostfildern, both of Fed. Rep. of Germany

[73] Assignee: Siemens Aktiengesellschaft, Munich, Fed. Rep. of Germany

[21] Appl. No.: 624,058

[22] Filed: Jun. 25, 1984

[30] Foreign Application Priority Data

Jun. 24, 1983 [DE] Fed. Rep. of Germany ....... 3322862

[51] Int. Cl.[4] .............................................. G11B 5/00
[52] U.S. Cl. .............................. 360/32; 340/347 SH; 360/5
[58] Field of Search ............... 360/32, 5; 340/347 SH, 340/347 M; 375/27, 28

[56] References Cited

PUBLICATIONS

Verzogerungseinheit Oscillostore; Siemens-Zeitschrift 45 (1971), Heft 10, Seiten 634 und 635.
Automatische Auswertung Von Magnetbandaufzeichnungen Mit Dem Oscillostore; Siemens-Zeitschrift 47 (1973), Heft 12, Seite 869 bis 872.

Primary Examiner—Raymond F. Cardillo, Jr.
Assistant Examiner—Alyssa H. Bowler
Attorney, Agent, or Firm—Kenyon & Kenyon

[57] ABSTRACT

A system for detecting and recording disturbances, e.g., transients, in periodic signals, wherein the system has a delay memory for storing sampled digital signal values of the periodic signals, is disclosed. In order to reduce the amount of data needed to be recorded, the sampled digital values are interim-stored in a read/write memory, from which the samples are read out each period of the periodic signal via an address control. The interim stored digital samples, which are the samples for the period of the periodic signal existing in time immediately preceding the present period, along with the samples from the present period, are fed to a digital comparator. The digital comparator compares the samples for the two signal periods, and depending on whether the samples differ by a predetermined threshold, generates a start or stop signal to an output device coupled to the delay memory for recording the occurrence of the disturbance.

3 Claims, 1 Drawing Figure

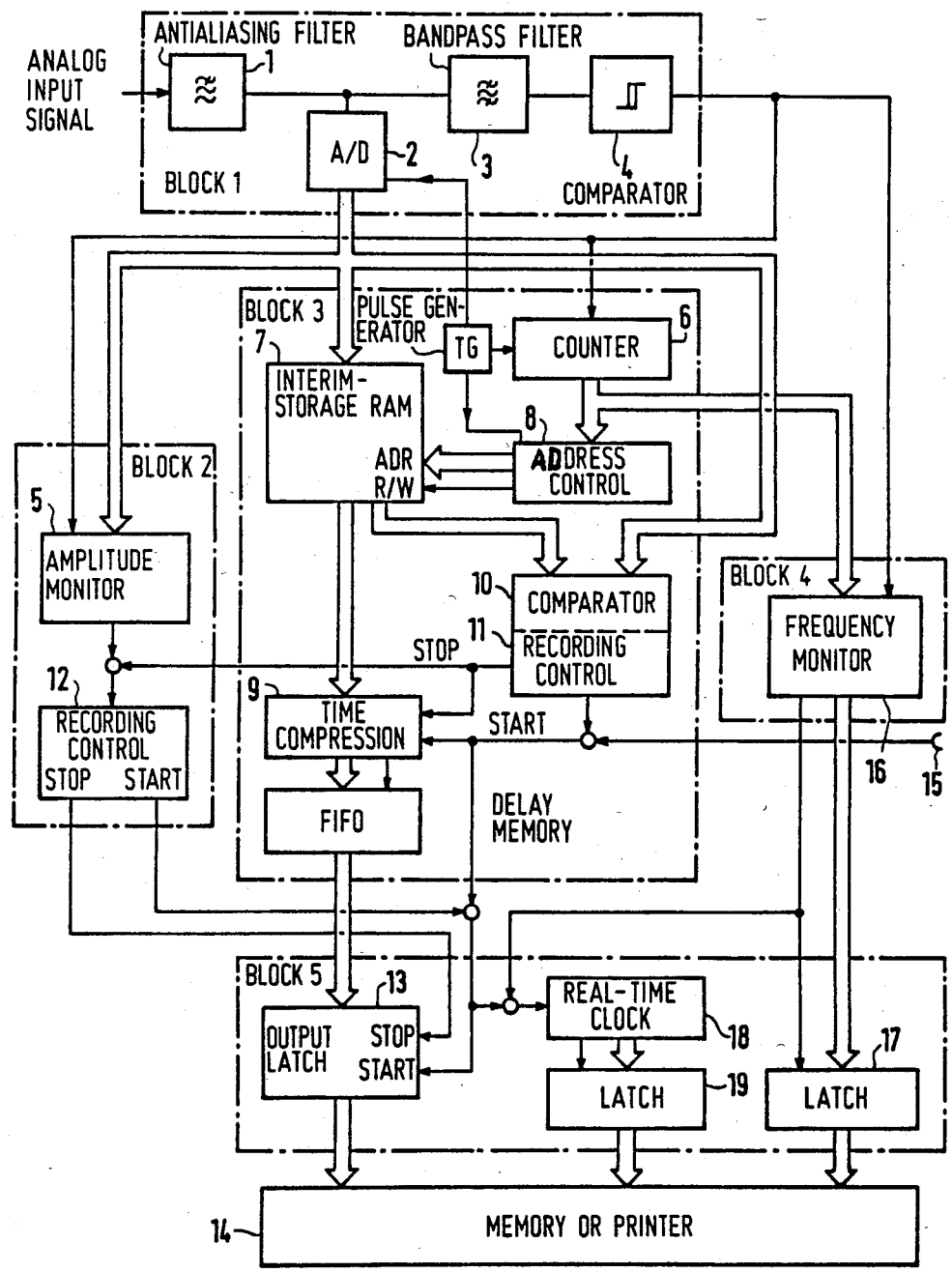

DISTURBANCE DETECTION AND RECORDING SYSTEM

BACKGROUND OF THE INVENTION

The present invention relates to a disturbance detection and recording system for detecting and recording disturbances, e.g., transients, in periodic signals. The system includes a delay memory for sampled digital signal values of the periodic signal and circuitry for the mutual comparison of successive signal periods as well as at least one disturbance-controlled start selector which supplies a starting pulse to an output device for, for example, recording the delayed signal values.

Such a system is described in the article "Delay Unit OSCILLOSTORE for the Detection of Trouble Values" in Siemens-Zeitschrift 45 (1971), no. 10, pages 634 and 635. From the data in the heading enttiled "Technical Data of a Six-Channel Design" of the article, it can be seen that the "on" duration of the recording equipment is 1 to 10 seconds. This "on" time begins with a starting signal for a high speed recorder serving as the output unit, which is delivered by a start selector, for instance, a du/dt stimulus. The "on" time is independent of the duration of the interface signal which is to be recorded. The "on" time can optionally be fixed in accordance with experience values. However, it can be expected that the actual duration of an interference signal frequently exceeds or falls short of the set "on" time, so that either valuable information is lost, and in the other case, recording material is additionally spent for normal conditions of no interest.

In an article "Automatic Evaluation of Magnetic Tape Recordings with the OSILLOSTORE" from Siemens Zeitschrift 47 (1973), no. 12, pages 869 to 872, it is explained under the heading "Conventional Measuring Techniques-Programmed Measurement", that, as soon as the measurement data show an undisturbed pattern again, the discriminators provided for detecting the interference or trouble turn the output device off again. While this method prevents the situation where data of a disturbance of interest are not recorded because of too short an "on" time, it does not prevent the recording of unimportant data of an interference which has become stationary, and thereby, waste of recording material.

SUMMARY OF THE INVENTION

It is an object of the present invention to detect all transients but to record no data which can be reconstructed from already recorded data.

The invention follows from the discovery that only the transient or transition states need be recorded and specifically, also such transients which lead a disturbance which has become stationary, into a stationary normal operating state. Stationary states themselves, be they normal operating states or trouble states that have become stationary, are themselves not to be recorded or outputted because they can be reconstructed at any time from the first or second period of the steady state.

The above and other objects of the present invention are achieved according to a preferred embodiment, by the provision that the digital signal values of a periodic input signal sampled by a sampling pulse sequence are interim-stored in a read/write memory (RAM) by the signal periods of the periodic signal. The sampling pulses furthermore are counted in a counter by the signal periods, and the number of sampling pulses counted in a signal period is stored in a register. The register contents are fed to an address control which determine the addresses of those signal values interim-stored in the read/write memory (RAM) which, together with corresponding signal values of a signal period immediately following the interim-stored signal period, are fed to a digital comparator which, depending on the disagreement or agreement of the signal values compared with each other, supplies a start or stop signal to an output device coupled to the delay memory for recording the disturbance.

In a preferred embodiment, the digital comparator determines whether the instantaneously arriving signal period belongs to a stationary or transient state and accordingly controls the output device for the digital signal values stored in the delay memory.

The periodic comparison of the instantaneous values takes place after an automatic matching of the comparison operation to the fundamental frequency of the analog input signal. This is advisable because the period of the fundamental of the periodic signal is as a rule not constant. Therefore, the address control of the read/write memory (RAM) takes into consideration the period in the comparison operation. This takes place while at the same time the sampling pulses falling into a period of the periodic input signal are counted. In addition, the frequency of the input signal may be monitored and recorded as a number in the event of a change.

Advantageously, a circuit for time compressing the signals to be delayed is inserted into the signal path between the read/write memory and the delay memory which is controlled by the output signals of the digital comparator. The compression factor can be preselected via a coding switch, for instance, in the ratios 1:4, 1:8, 1:16 and 1:32. These ratios are cited only as examples; other compression ratios can be executed also at any time.

A further step toward data reduction is the subdivision of the transient processes into regions with high-frequency components in the input signal and regions in which the input signal is of the operating frequency but its amplitude does not change. In the last-mentioned regions, a reduction of the recording rate can take place without losing information thereby. In order to carry out a data reduction in these regions, the tolerance threshold of the difference of the signal values compared with each other in the digital comparator is slightly increased and in addition, periodic monitoring of the amplitude is carried out. Advantageously, monitoring of the amplitude for small not-transient changes takes place in addition to the periodic comparison of the instantaneous values of the signal, in an amplitude-monitoring unit. If such changes occur, the recording takes place only at a reduced recording rate.

BRIEF DESCRIPTION OF THE DRAWINGS

The invention will be explained in greater detail with reference to the single drawing FIGURE which shows a block diagram of an embodiment of the invention.

DETAILED DESCRIPTION

With reference now to the drawing, individual units of the overall system are combined in blocks 1 to 5 framed by the dashed lines. Block 2 serves for the monitoring of the amplitude via amplitude monitor 5 and the corresponding recording control 12. Block 3 comprises units for the periodic comparison of instantaneous values via comparator 10 and the corresponding recording control 11 as well as interim memory 7, data transport circuitry, time compressor 9 and the delay memory FIFO. Block 4 contains a frequency monitoring circuit 16, and in Block 5, the data output device 13 and a real-time clock 18 are combined.

Block 1 contains an antialiasing filter 1 as the input circuit for the analog input signal to be monitored. The output of filter 1 is coupled to the input of an analog-to-digital converter 2 which includes a sampler, e.g., a sample/hold circuit, not shown in detail. The output of the filter 1 is further coupled to the input of a bandpass filter 3, the center frequency of which corresponds to the operating frequency of the analog input signal. The output of the bandpass filter 3 is coupled to the input of a comparator 4 which delivers a clock signal for the operation of the system, which have to be carried out synchronously with the fundamental of the input signal. To this end, its output signals are fed to an amplitude monitoring circuit 5 contained in Block 2 and are further fed to a counter 6 within Block 3. Counter 6 controls the start and end of a counting period for the sampling pulses from a pulse generator TG which are fed to the analog-to-digital converter 2 and to an address control 8. The digital values which are sampled and accumulated in the analog-to-digital converter 2 are fed to the input of a read/write memory (RAM) 7, in which always at least one full period of the input signal is interim-stored. The address control 8 for RAM 7, which is coupled to an output register of counter 6 for storing the contents of the counter, has its output coupled to the address inputs of the read/write memory RAM 7. The address control 8 has, first, the purpose of addressing the read/write memory RAM 7 continuously in a cyclical manner. This addressing is comparable to a pointer which addresses successively, storage cells arranged in circular fashion, as in a clock. This mode of operation is brought about by an address counter modulo RAM-length contained in the address control 8, which means that the address counter, if it has addressed the last read/write memory cell, again starts at the first one. The R/W (read/write) signal from the address control 8 has the further purpose, if the address counter was advanced by one, to read out the content of the read/write storage cell loaded with the oldest sampling value, to the time compressor 9 and to write with the next clock pulse into the same cell the last value made available by the analog-to-digital converter 2. The address control 8 therefore always reads out the oldest interim-stored instantaneous value from the read/write memory 7 and writes the last instantaneous value into the same memory. The part of Block 3 described so far therefore represents a kind of shift register which is so long that it can accommodate at least one fundamental period of the analog input signal. The instantaneous value which is supplied by the analog-to-digital converter 2 and is stored in the read/write memory RAM 7 is at the same time interim-stored in a register contained in a digital comparator 10.

In addition, the address control 8 determines the address at which the sampled value of the preceding period is stored in the read/write memory RAM 7, which is required for a comparison operation.

This purpose is served by the information which is deposited in the output register of the counter 6. Counter 6 counts continuously the number of samplings which will be performed during one period of the fundamental frequency of the analog input signal. For the beginning and the end of its counting, counter 6 makes use of a square wave signal of the comparator 4 which is running synchronously with the fundamental of the periodic input signal. The determined number of samplings is always stored for the duration of a period in the mentioned output register of the counter 6. This value, which indicates the number of samplings in the previous period, is subtracted by the address control 8 from the instantaneous address counter value and thereby obtains the address of the read/write storage cell in which the sampling value of the previous period is stored, which is required for the comparison operation. By means of the R/W signal, the address control 8 causes the transfer of the previous period value from the read/write memory RAM 7 into a second register of the digital comparator 10. In the digital number comparator 10, digital values stored in the read/write memory RAM 7 are compared with the digital values of the following period. Any difference is measured with respect to a tolerance threshold. If the tolerance threshold is exceeded, a recording control 11 is actuated which is part of the comparator 10.

The data output of the read/write memory RAM 7 is furthermore connected to a time compression circuit 9 which transmits during a steady state of the analog input signal only every $n^{th}$ instantaneous value from the read/write memory RAM 7 to a delay memory FIFO. Two inputs of the recording control 11 are connected to inputs of the time compression circuit 9. The stop output of the recording control 11 is coupled to an input of the time compressor 9 for activating the time compression, and its start output is coupled to an input of the compression circuit 9 which cancels the time compression. the stop output of the recording control 11 is also connected to the input of a recording control set 12 of block 2 which is also addressed by an amplitude monitor 5. The stop and start signal outputs of the recording control set 12 are connected to corresponding inputs of an output latch 13 disposed in block 5. The latch 13 always transfers from the output of the delay memory FIFO, numerical values in the form of an on-line recording, to a data memory or printer 14 or equivalent output device. If in the digital number comparator 10 the tolerance threshold in not exceeded during at least one period of the analog input signal, then the control 11 restarts the time compression circuit 9 and starts the recording control set 12 coupled to the amplitude monitor 5 in order to twice empty-out the delay memory FIFO.

The described circuit has the effect that several periods of time compressed instantaneous values and one period with any value of a preceding stationary state, the transition signals themselves and one period of the new steady-state operation and several further time-compressed periods are recorded. As external trigger input 15 causes the same effect as exceeding the tolerance threshold during the comparison operation. If the amplitude monitor 5 determines an amplitude change at the operating frequency, only a few time-compressed periods before and after the response of the amplitude monitor 5 are recorded.

Also in the event of a flush short circuit or null signal of the analog input signal, the circuit does not malfunction because the state in the output register of the counter 6 is preserved, i.e., the comparator 4 furnishes no signal. The recording started by the short circuit is therefore switched off as in any other transition from a steady-state operation, as soon as, for at least one period of the last-determined period duration of the fundamental frequency of the input signal, no difference has been found in the comparison operation exceeding the tolerance threshold.

The frequency monitor 16 contained in block 4 causes a separate latch 17 to read out a frequency value in the case of a frequency change. Before the start of every recording, the real time stored in a further latch 19 coupled to a real time clock 18 is outputted to the input device 14.

For addressing the recording device, priorities are fixed. The first priority is given to the periodic instantaneous-value comparison; the second priority is given to the amplitude monitor and the third priority to the frequency monitor. In the event of only slow changes of the fundamental frequency of the analog input signal, only the frequency value will be recorded.

On and off switching processes of monitored analog input signals are treated like other transitions between two stationary operating states.

It is understood that the proposed system can be designed with a multiplexer at the input and a demultiplexer at the output having several channels.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than restrictive sense.

What is claimed is:

1. In a system for detecting and recording disturbances in a periodic signal, said system having means for digitizing samples of the periodic signal, delay memory means for storing and delaying the digitized samples of the periodic signal, comparator means for comparing the digitized samples from successive signal periods of the periodic signal and means responsive to a disturbance in the periodic signal for generating a signal for transferring delayed digitized samples stored in the delay memory means to an output device for recording the delayed signal samples, the improvement comprising means for generating a sequence of sampling pulses for controlling the generation of said digitized samples by said digitizing means, interim storage means for storing the digitized samples for each successive signal period, means for counting the sampling pulses in each successive signal period, means for storing a count of the number of sampling pulses counted for each signal period, means coupling the digitized samples from said digitizing means to said comparator means and address control means coupled to said interim storage means and to said storing means for addressing said interim storage means in response to a count in said storing means whereby the digitized samples stored in said interim storage means are fed to said comparator means, said comparator means thereby comparing the digitized samples from said interim storage means and from said digitizing means, said samples being from successive signal periods of said periodic signal, and generating a control signal for transferring the digitized samples in said delay memory means to said output recording device if said digitized samples for successive signal periods fed to said comparator means differ by a predetermined threshold amount.

2. The improvement recited in claim 1, further comprising time compression means controlled by said comparator means coupled between said interim storage means and said delay memory means, said comparator means controlling said time compression means whereby said time compression means compresses said digitized samples in time when said digitized samples fed to said comparator means do not exceed said predetermined threshold amount.

3. The improvement recited in claim 1, further comprising means for monitoring the amplitude of the digitized samples, whereby, if non-transient changes below a preset threshold occur in said periodic signal, said output recording device records said digitized samples at a rate lower than if transient changes occur in said periodic signal.

* * * * *